June 10, 1969 N. R. BUCK 3,448,516

METHOD OF PREPARING PRINTED WIRING

Filed Feb. 14, 1966

INVENTOR.
NORMAN R. BUCK
BY
Meyers & Peterson
ATTORNEYS

United States Patent Office 3,448,516

Patented June 10, 1969

3,448,516

METHOD OF PREPARING PRINTED WIRING

Norman R. Buck, 908 Greenvale, Northfield, Minn. 55057

Filed Feb. 14, 1966, Ser. No. 534,619

Int. Cl. B41m 3/08; H05k 3/00

U.S. Cl. 29—625 9 Claims

ABSTRACT OF THE DISCLOSURE

A technique for the preparation of printed wiring which utilizes a laminate of a metallic conductor and a substrate, the substrate being pre-punched prior to laminating, with the conductor being bonded to the substrate with a film of an etch resistant adhesive bonding material, and with the thickness of the adhesive bonding material being sufficient to impart an etch resistant capability thereto. A pre-punched substrate-metallic conductor laminate system is coated along the surface of the metallic conductor with a suitable resist substance, and the system is exposed to a chemical milling operation to provide a circuit of the desired configuration.

The present invention relates generally to an improved technique for preparing printed wiring, and more specifically to a technique for preparing printed wiring from thin laminate structures of metal and insulation, wherein the insulating portion of the laminate structure is treated during the preparation technique so as to enable the making or establishing of an electrical contact to either surface of the product. The resultant product is therefore double or two-sided for electrical purposes, the technique of the present invention permits the expeditious preparation of such a material.

In accordance with the presently available techniques for preparing printed wiring, particularly flexible printed wiring, any metallic surface or conductor area which is not desired to be etched must be coated with a resist substance along predetermined areas thereof. This permits the entire material to be subjected to an acid or other etchant substance so as to chemically mill, or otherwise remove the exposed surfaces of the metal or conductor from the laminate structure. These present techniques are readily adaptable to preparing individual units or individual circuit patterns, wherein individual sides of the circuitry are treated independently in separate operation, however, none of the techniques of the present invention are readily adaptable for use in treating printed wiring continuously on a roll-to-roll basis. In this connection, roll-to-roll production, where appropriate, has been found to be desirable from an economic standpoint, since its use permits expeditious handling of the laminate materials. Unfortunately present day acid resists make it difficult to treat both sides of a laminate structure, since the cost of these resists is normally excessive and the costs of application and removal is generally high. Therefore, whenever possible, the application of a layer of resist is avoided.

In accordance with the preferred modification of the present invention, a laminate structure is prepared utilizing relatively thin films of a metal such as copper or the like and an insulating material such as stress oriented polyethyleneterephthalate or the like. The insulation material is initially punched, perforated, or otherwise provided with bores which extend through the thickness thereof, and this pre-treated film and one surface of a metallic layer are bonded together. Prior to bonding, the metallic layer is coated along one major surface with an adhesive which consists essentially of an etch resistant resinous bonding material, this etch resistant resinous material being exposed through the bore which has previously been formed in the insulating material. The exposed major surface of the metallic conductive layer is then preferentially coated, as and where desired, with a layer of an etchant resist composition, and the entire unit is then subjected to an etching operation. Thereafter, the resist material is removed from the metallic conductive layers remaining on the laminate, and the resistant adhesive bond film is removed from the surface of the metallic layer through the bores formed in the insulating member. This provides electrical access to both surfaces of the metallic film, and the circuitry formed by this expeditious improved technique may accordingly be more versatile in its application and use.

It is therefore an object of the present invention to provide an improved technique for expeditiously and economically preparing double-sided printed wiring.

It is yet a further object of the present invention to provide an improved technique for preparing double-sided printed wiring which is capable of preparation on a roll-to-roll basis with a single application of resist.

It is yet a further object of the present invention to provide an improved technique for preparing double-sided printed wiring which utilizes a resist coating on certain pre-determined areas of one surface only of the metallic layer.

Other and further objects of the present invention will become apparent to those skilled in the art upon a study of the following specification and appended claims, and accompanying drawings wherein:

Figure 1:
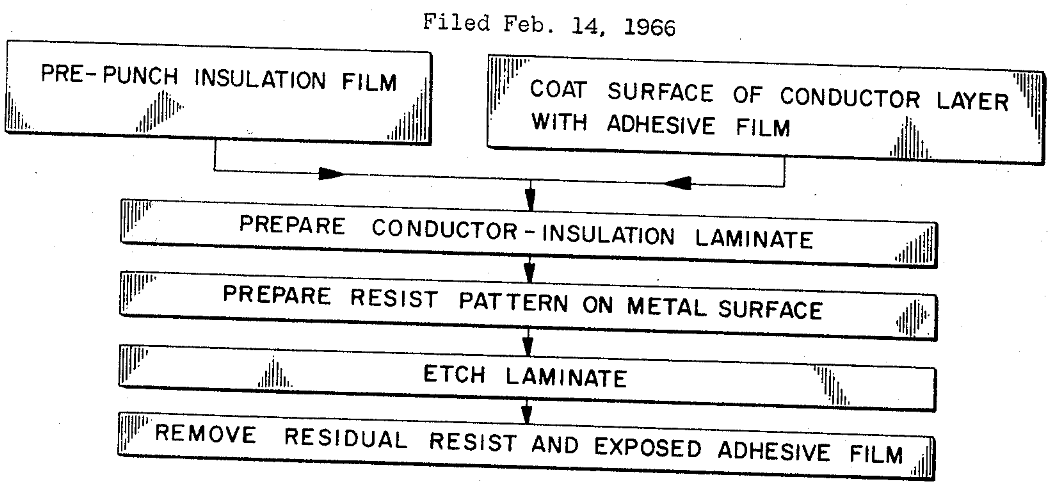
FIGURE 1 is a flow diagram illustrating the various steps encountered in the improved technique of the present invention.
Figure 2:
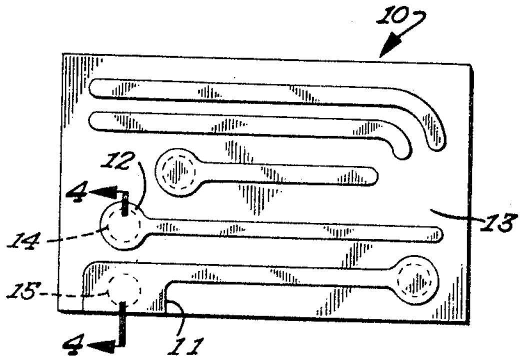
FIGURE 2 is a top plan view of printed wiring prepared in accordance with the technique defined in the flow diagram of FIGURE 1.
Figure 3:
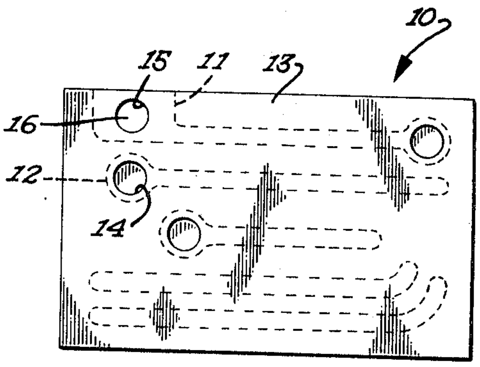
FIGURE 3 is a bottom view of the circuitry of FIGURE 2.
Figure 4:
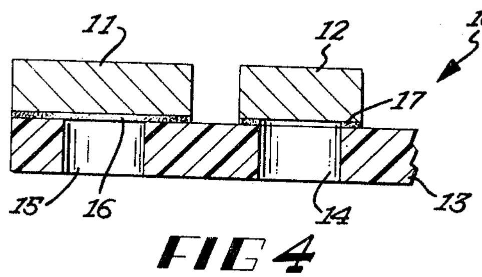
FIGURE 4 is a vertical sectional view taken along the line and in the direction of 4—4 of FIGURE 2 and showing one of the exposed areas of copper in the bores still coated with etch resistant adhesive.

In accordance with the preferred technique of the present invention, the preparation of the circuitry shown generally at 10 in FIGURES 2–4, is prepared in accordance with the technique of the schematic or flow diagram of FIGURE 1. It will be observed that the initial operations include the pre-punching of the insulating layer so as to provide bores which traverse or extend through the thickness of the insulation film. The conductor material, which is preferably metallic, and which is, of course, normally copper, is coated uniformly with a polyester base adhesive. One etch resistant adhesive which may function on a solvent free basis for laminating and which has been found particularly desirable in accordance with the technique of the present invention is a polyester base adhesive consisting essentially of polyethyleneterephthalate, however, it will be appreciated that other polyester base adhesives such as copolymers of ethylene glycol and ethylene terephthalate and ethylene sebacate may be employed as well. Each of these polyester base materials is resinous in nature, and has been found to be resistant chemically to reasonably concentrated acid sulphates such as, for example, hydrogen sulphate or ammonium persulphate particularly when applied as continuous films of about 0.7 mil or greater. Adhesive materials of this type are commercially available.

After coating the copper, and punching the insulation material the two bodies are brought together to form a single laminate structure, the adhesive film which has previously been applied to the copper being utilized to bond the copper to the insulation member. A solvent-free system is preferably used at the bonding operation, and therefore heat alone may be utilized to treat the copper in order to activate the adhesive to form the bond with the insulating material without danger of bubble formation. It will be appreciated that a solvent system may be used during the application of the adhesive film to the copper, however this is not critical and any suitable arrangement may be utilized for preparing the adhesive film on the copper surface.

Subsequent to the preparation of the laminate, the copper which covers generally the entire surface of the insulation, is coated on its exposed side with a suitable acid resist material. This resist may be a photosensitive resist such as that product known in the trade as KPR, a product sold commercially by the Eastman Kodak Company of Rochester, N.Y., or any other suitable photosensitive resists which are likewise commercially available. These other resists may be applied in any other appropriate or desired manner, such as, for example, by silk screen techniques or the like.

For high production of printed wiring, it is generally preferred that the circuitry be prepared on a roll-to-roll basis. Therefore, the circuitry raw materials will initially be disposed on a first roll, and thereafter taken from this roll and passes through one or more operating stations, subsequent to which it is taken up on a take-up roll and thereby made ready for the next operating step or series of steps. The application of the adhesive film to the copper, the pre-punching of the insulation film as well as the laminating steps and resist application steps may all be conducted on roll-to-roll basis and accordingly be reasonably continuous in nature.

Subsequent to the application of the resist and its proper disposition on the copper, the laminate is exposed to the effects of an etchant bath. This etchant bath may consist essentially of an acid sulphate, such as, for example, hydrogen sulphate, or ammonium persulphate. Ammonium persulphate has generally been found preferable for use in connection with etching of printed wiring laminates. The laminate is exposed to the effects of such a bath for a period sufficient to etch through the conductors which are available on the surface of the film. This time interval may vary depending upon the concentration of the etchant solution, the thickness of the copper, as well as the temperature of the solution, however, these parameters are generally understood and critical only to the extent that the material is etched sufficiently long to etch through the copper. After removal of the exposed copper, the resist pattern which remains on the surface of the copper may be removed, after which the exposed polyester adhesive material may be removed from the bottom of the copper surface. For general removal purposes, methylene-chloride is used. This material is generally considered to be non-toxic in nature and accordingly relatively easily handled by unskilled craftsmen. This removal may be expedited, if desired, by exposing the copper portion of the laminate structure to the action of a moderately rigid steel buffing brush, or the like. This combined effect of brushing along with simultaneous exposure to methylene-chloride is generally sufficient to remove any traces of the polyester adhesive from the surface of the copper. The circuitry may then be treated for application of active or inactive circuit components thereto, and as can be appreciated from the illustrations in FIGURES 2–4, connections may be appropriately made to either side of the circuitry. This is accomplished even though there is only a single layer of copper available, as well as only a single layer of insulating film.

Turning now to the details of this structure shown in FIGURES 2–4, the finished product, that is the printed wiring, is shown generally at 10, this wiring including conductors 11 and 12 laminated to the insulating material 13. Holes or bores are provided through the insulating material as at 14 and 15, and the copper material 11 and 12 being exposed therethrough. With particular attention being directed to FIGURE 4, it will be observed that the adhesive film as shown at 16 covers the perforation or hole 15, however an adhesive film area is shown removed over the perforation or hole 14. In the finished product, of course, the adhesive material 16 covering the copper through the hole 15 will be removed. The drawings may illustrate the thickness of the copper and the insulation material on an enlarged and unrealistic scale, and it will be appreciated therefore, that the scale utilized for these drawings are for purposes of illustrating the principles and not for illustrating the specific dimensions of the finished product. As an example, for roll-to-roll production, the copper will generally have a thickness in the finished product of about 1 mil, and the insulating material may preferably be of the order of 0.5 mil when stress oriented polyethyleneterephthalate is utilized, however thicknesses of from 0.25 mil up to about 2 mils may be satisfactorily utilized. Stress oriented polyethyleneterephthalate is available commercially under the code name of "Mylar" from the E. I. du Pont de Nemours Corporation of Wilmington, Del. It will be appreciated that other materials such as, for example, polyethylene, polypropylene or the like may be employed, however the acid resistant characteristics of polyethyleneterephthalate render it superior as a film forming insulation material for printed circuitry application.

It will be appreciated that the specific examples given herein are for purposes of illustration only, and those persons skilled in the art may depart from these specific illustrations without departing from the spirit of the present invention.

I claim:

1. In the method of preparing a printed wiring laminate structure from a layer of a chemically millable metallic conductor and at least one relatively thin flexible film of an insulating material, said method comprising:

(a) punching said film of insulating material at certain predetermined locations and along certain predetermined areas to form bores therein which extend through the thickness thereof;

(b) coating one major surface of said metallic layer with a film of an adhesive consisting essentially of an etchant resistant resinous adhesive bonding material, the thickness of said film being sufficient to impart an etch resistant capability thereto;

(c) placing the adhesive coated surface of said metallic conducting layer and one surface of said perforated insulating film in firm contact, to bond said metallic layer to a surface of said insulating material to form a laminate structure therefrom;

(d) coating certain predetermined areas only of the exposed major surface of said metallic conductive layer including those areas superimposed upon the bores formed in said insulating material with a layer of an etchant resist composition, the remaining areas of the metallic conductive layer and the entire area of the exposed insulating material being free of said etch resist composition;

(e) subjecting the exposed surface areas of the metallic conductive layer of said laminate structure to a chemical milling composition to etch the exposed metallic conductive layer therefrom; and (f) removing the exposed adhesive areas from the surface of said metallic conductive layer to expose the metal through said bores.

2. The method as set forth in claim 1 being particularly characterized in that said adhesive film covers the surface of said metallic conductor substantially uniformly, and is substantially free of solvents prior to being placed in contact with said insulating film.

3. The method as set forth in claim 1 being particularly characterized in that said insulating film is stress-oriented polyethylene terephthalate.

4. The method as set forth in claim 1 being particularly characterized in that said laminate is free to flex, and wherein both surfaces thereof are simultaneously exposed to etchant.

5. The method as set forth in claim 4 wherein each step is conducted on a roll-to-roll basis.

6. The method as set forth in claim 1 being particularly characterized in that said metal conductor is soft electrolytic copper.

7. The method as set forth in claim 1 being particularly characterized in that said etching bath consists essentially of ammonium persulfate.

8. The method as set forth in claim 2 wherein said adhesive film consists essentially of a polyester selected from the group consisting of polyethylene terephthalate and a copolymer of ethylene glycol with ethylene terephthalate and ethylene sebacate.

9. The method as set forth in claim 8 wherein said adhesive film has a thickness greater than 0.7 mil.

References Cited

UNITED STATES PATENTS

| | | | |
|---|---|---|---|
| 3,024,151 | 3/1962 | Robinson | 156—150 |
| 3,098,951 | 7/1963 | Ayers et al. | 317—101 |
| 3,200,020 | 8/1965 | Schroeder | 29—625 XR |
| 3,258,387 | 6/1966 | Brown et al. | 161—140 |
| 3,264,402 | 8/1966 | Shaheen et al. | 29—625 XR |
| 3,272,909 | 9/1966 | Bruck et al. | 29—625 XR |
| 3,276,106 | 10/1966 | Bester et al. | 29—625 |

JOHN F. CAMPBELL, *Primary Examiner.*

ROBERT W. CHURCH, *Assistant Examiner.*

U.S. Cl. X.R.

29—626; 156—3; 174—68.5